(12) United States Patent
Ausserlechner

(10) Patent No.: US 9,720,050 B2
(45) Date of Patent: *Aug. 1, 2017

(54) SYSTEMS AND METHODS FOR OFFSET REDUCTION IN SENSOR DEVICES AND SYSTEMS

(71) Applicant: Infineon Technologies AG, Neubiberg (DE)

(72) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/886,864

(22) Filed: Oct. 19, 2015

(65) Prior Publication Data

US 2016/0047863 A1 Feb. 18, 2016

Related U.S. Application Data

(63) Continuation of application No. 13/753,190, filed on Jan. 29, 2013, now Pat. No. 9,164,155.

(51) Int. Cl.
*G01R 33/00* (2006.01)
*G01R 33/07* (2006.01)

(52) U.S. Cl.
CPC ..... *G01R 33/0017* (2013.01); *G01R 33/0029* (2013.01); *G01R 33/07* (2013.01); *G01R 33/075* (2013.01); *G01R 33/077* (2013.01)

(58) Field of Classification Search
USPC ......... 324/225, 251, 207.2, 202, 227, 117 H, 324/207.13, 750.01, 750.3, 76.11
See application file for complete search history.

(56) References Cited

U.S. PATENT DOCUMENTS 3,823,354 A 7/1974 Jansen
4,041,026 A 8/1977 Ogata
(Continued)

FOREIGN PATENT DOCUMENTS

CN 101762796 A 6/2010
CN 101923266 A 12/2010
(Continued)

OTHER PUBLICATIONS

Radioing.com, Tips for Electronic Printed Circuit Board Design, "PCB Layout" section, Dec. 11, 2013.
(Continued)

*Primary Examiner* — Melissa Koval
*Assistant Examiner* — Nasima Monsur
(74) *Attorney, Agent, or Firm* — Eschweiler & Potashnik, LLC

(57) ABSTRACT

Embodiments relate to systems and methods for reducing errors in sensor devices and systems. In embodiments, the sensor devices comprise magnetic field sensor devices, such as ordinary or vertical Hall sensor devices, and the error to be reduced is a residual offset error, though in other embodiments other sensor devices can be used and/or other types of errors can be targeted for reduction or elimination. In one embodiment, at least two such sensor devices not electrically coupled with one another are sequentially operated in a spinning current-type mode such that an individual output signal from each of the at least two sensor devices is obtained. A total output signal can then be calculated, such as by averaging or otherwise combining the individual output signals from each sensor device.

14 Claims, 5 Drawing Sheets

(56) References Cited

U.S. PATENT DOCUMENTS

| | | | |
|---|---|---|---|
| 5,055,786 A | 10/1991 | Wakatsku | |
| 5,278,497 A | 1/1994 | Ariyoshi | |
| 5,418,455 A | 5/1995 | Takaishi et al. | |
| 5,548,151 A | 8/1996 | Funaki et al. | |
| 5,645,527 A | 7/1997 | Beck | |
| 5,747,995 A | 5/1998 | Spies | |
| 6,064,202 A * | 5/2000 | Steiner | G01R 33/075 324/225 |
| 6,111,402 A | 8/2000 | Fischer | |
| 6,326,782 B1 | 12/2001 | Schroeder | |
| 6,362,618 B1 * | 3/2002 | Motz | G01R 33/07 324/225 |
| 6,727,563 B1 | 4/2004 | Hohe | |
| 6,768,301 B1 * | 7/2004 | Hohe | G01R 33/0094 324/225 |
| 6,917,088 B2 | 7/2005 | Takahashi | |
| 6,946,834 B2 | 9/2005 | Van Zon et al. | |
| 7,078,893 B2 | 7/2006 | Nakano et al. | |
| 7,317,251 B2 | 1/2008 | Meyer-Berg | |
| 7,425,821 B2 | 9/2008 | Monreal | |
| 7,923,987 B2 | 4/2011 | Ausserlechner | |
| 8,030,918 B2 | 10/2011 | Doogue | |
| 8,058,866 B2 | 11/2011 | Granig et al. | |
| 8,093,891 B2 | 1/2012 | Rocznik | |
| 8,332,103 B2 | 12/2012 | Greer et al. | |
| 8,409,415 B2 | 4/2013 | Liu | |
| 8,659,411 B2 | 2/2014 | Fink | |
| 8,829,900 B2 | 9/2014 | Ausserlechner | |
| 8,896,303 B2 | 11/2014 | Ausserlechner | |
| 8,903,602 B2 | 12/2014 | Baille et al. | |
| 9,063,187 B2 | 6/2015 | Hellwig et al. | |
| 9,103,853 B2 | 8/2015 | Ausserlechner et al. | |
| 9,222,992 B2 | 12/2015 | Ausserlechner et al. | |
| 9,279,864 B2 | 3/2016 | Ausserlechner et al. | |
| 2003/0102909 A1 | 6/2003 | Motz | |
| 2003/0179510 A1 | 9/2003 | Hayakawa | |
| 2004/0085062 A1 | 5/2004 | Miyata et al. | |
| 2005/0174112 A1 | 8/2005 | Wakabayashi et al. | |
| 2005/0258840 A1 * | 11/2005 | Ausserlechner | G01D 3/02 324/706 |
| 2007/0170533 A1 | 7/2007 | Doogue et al. | |
| 2007/0200564 A1 | 8/2007 | Motz et al. | |
| 2007/0210298 A1 * | 9/2007 | Finkelstein | H01L 29/66984 257/9 |
| 2008/0297955 A1 | 12/2008 | Ausserlechner | |
| 2009/0001965 A1 | 1/2009 | Ausserlechner et al. | |
| 2009/0322325 A1 | 12/2009 | Ausserlechner | |
| 2010/0156394 A1 | 6/2010 | Ausserlechner et al. | |
| 2011/0071737 A1 | 3/2011 | Greer | |
| 2011/0074405 A1 | 3/2011 | Doogue | |
| 2011/0199623 A1 | 8/2011 | Okuyama | |
| 2012/0001279 A1 | 1/2012 | Hioka et al. | |
| 2012/0029767 A1 | 2/2012 | Bailie | |
| 2013/0043865 A1 | 2/2013 | Makuth et al. | |
| 2013/0085710 A1 | 4/2013 | Kautzsch | |
| 2013/0265036 A1 | 10/2013 | Friedrich et al. | |
| 2013/0265041 A1 | 10/2013 | Friedrich et al. | |
| 2013/0335072 A1 | 12/2013 | Malzfeldt | |
| 2014/0042410 A1 | 2/2014 | Chen | |
| 2014/0176323 A1 | 6/2014 | Kim | |
| 2014/0195107 A1 | 7/2014 | Park et al. | |
| 2014/0203803 A1 | 7/2014 | Ming | |
| 2014/0218019 A1 | 8/2014 | Ausserlechner | |
| 2014/0266163 A1 | 9/2014 | Schaffer | |
| 2014/0347045 A1 | 11/2014 | Paul | |
| 2015/0044778 A1 | 2/2015 | Wang | |
| 2015/0102808 A1 | 4/2015 | Ogomi et al. | |
| 2015/0115932 A1 | 4/2015 | Michelutti et al. | |
| 2015/0137797 A1 | 5/2015 | Ausserlechner | |
| 2015/0219472 A1 | 8/2015 | Ausserlechner | |
| 2015/0253157 A1 | 9/2015 | Granig | |
| 2015/0285661 A1 | 10/2015 | Ausserlechner | |
| 2015/0309127 A1 | 10/2015 | Ausserlechner | |
| 2015/0323568 A1 | 11/2015 | Schmitt | |
| 2015/0323613 A1 | 11/2015 | Ausserlechner | |
| 2015/0323614 A1 | 11/2015 | Ausserlechner | |
| 2015/0331070 A1 | 11/2015 | Koeck et al. | |
| 2015/0354999 A1 | 12/2015 | Ausserlechner | |
| 2016/0041238 A1 | 2/2016 | Bai | |
| 2016/0178397 A1 | 6/2016 | Jost | |
| 2017/0153301 A1 | 6/2017 | Ausserlechner | |

FOREIGN PATENT DOCUMENTS

| | | |
|---|---|---|
| DE | 4302342 | 7/1993 |
| DE | 10150950 C1 | 6/2003 |
| DE | 102006037226 A1 | 2/2008 |
| EP | 1438755 | 1/2005 |
| JP | 1251763 | 10/1989 |
| WO | 2004/025742 | 3/2004 |
| WO | 2008/048379 A1 | 4/2008 |
| WO | 2009/050673 | 4/2009 |

OTHER PUBLICATIONS

Zhu et al., Localization of a Stationary Source within a Uniform Circular Sensor Array, IEEE, 2007.

Non Final Office Action Dated May 4, 2016 U.S. Appl. No. 14/299,563.

Ausserlechner, Udo. "Limits of Offset Cancellation by the Principle of Spinning Current Hall Probe." Infineon Technologies AG, 4 pages, Oct. 2004.

Vanha, Ralph. "Trench-Hall Devices". Journal of Microelectromechanical Systems, vol. 9, No. 1, Mar. 2000, pp. 82-87.

Munter, P J A. "A Low-Offset Spinning-current Hall Plate." Sensors and Actuators, A21-A23, 1990, pp. 743-746.

De Jong, Paul C. "40.1 Smart Silicon Sensors—Examples of Hall-effect Sensors." Sensors 2002 Proceedings of IEEE, 5 pages.

German Office Action, Application No. 102013110333.1, mailed Jun. 2, 2014, 7 pages.

Chinese Office Action, Application No. 201210345928.4, dated Oct. 10, 2014, 14 pages.

"Chip Card & Security ICs." Infineon Technologies AG, SLM76CF5120P, Short Product Information 11.08, 9 pages.

"Package Information." SOT23, Infineon Technologies AG, 1 page.

"Angle Sensor, GMR-Based Angular Sensor." Data Sheet, TLE5009, Rev. 1.1, Apr. 2012, 32 pages.

"Angle Sensor, GMR-Based Angle Sensor." Data Sheet, TLE5012B, V 1.1, Jan. 2012 Final, 49 pages.

Notice of Allowance, U.S. Appl. No. 13/753,190 dated Jun. 23, 2015.

Final Office Action, U.S. Appl. No. 13/753,190 dated Apr. 6, 2015.

Non-Final Office Action, U.S. Appl. No. 13/753,190 dated Oct. 8, 2014.

Baker, Bonnie. PCB signal coupling can be a problem, www.edn.com/electronics-blogs/bakers-best/4426162/PCB-signal-coupling-can-be-a-problem, Dec. 2013.

Bailey, Michael. General Layout Guidelines for RF and Mixed-Signal PCBs. www.maximintegrated.com/en/app-notes/index.mvp/id/5100. Sep. 2011.

Notice of Allowance Dated Nov. 14, 2016 U.S. Appl. No. 14/299,563.

Non Final Office Action Dated Oct. 31, 2016 U.S. Appl. No. 14/317,063.

Final Office Action received on May 4, 2017 in connection with U.S. Appl. No. 14/317,063.

Non-Final Office Action received on Jun. 16, 2017 in connection with U.S. Appl. No. 15/432,167.

\* cited by examiner

SYSTEMS AND METHODS FOR OFFSET REDUCTION IN SENSOR DEVICES AND SYSTEMS

REFERENCE TO RELATED APPLICATION

This application is a continuation of U.S. application Ser. No. 13/753,190 filed on Jan. 29, 2013, the contents of which are incorporated by reference in their entirety.

FIELD

The invention relates generally to sensors and more particularly to offset reduction in sensor devices and systems.

BACKGROUND

Magnetic field sensors, such as Hall sensors, are sensitive to magnetic fields but can suffer from offset error. Offset error is the presence of an output signal in the absence of some input quantity. In an example related to Hall sensors, the offset error would be an output signal indicative of an input magnetic field when in fact no magnetic field is present. Offset error can affect both ordinary Hall devices and vertical Hall devices.

Offset error can relate to different causes, two of which are raw offset error and residual offset error. Raw offset error can refer to an offset error present in a particular operating phase. Residual offset error can refer to an offset error present in an overall or total output signal, such as a signal that is a combination of those from individual operating phases.

One approach for reducing or eliminating offset error is using a multi-terminal Hall sensor. Four-terminal Hall sensors can be operated in a spinning current-type mode, which changes the couplings of the terminals in each of multiple clock phases such that any offset is reduced when the signals from the multiple clock phases are combined. Three-terminal Hall devices typically require use of at least two devices and a modified spinning-current technique in order to be similarly operated. Even so, the residual offset error can remain higher than desired, such as in the range of about 1 milli-Tesla (mT).

SUMMARY

Embodiments relate to systems and methods for reducing errors in sensor devices and sensor systems.

In an embodiment, a sensor system comprises a plurality of sensor devices positioned proximate each other such that each of the plurality of sensor devices is configured to sense essentially the same condition; control circuitry configured to operate each of the plurality of sensor devices in at least one partial spinning current mode comprising at least two phases to obtain a partial spinning current output signal in each phase by selectively coupling a first of the plurality of terminals of each sensor device as a supply terminal and a second of the plurality of terminals of each sensor device as a signal terminal in each phase such that, in sequential phases, current flows in different directions in each sensor device and different ones of the plurality of terminals of each sensor device are signal terminals; and output circuitry configured to determine a system output signal from partial spinning current output signals of the at least two phases of each of at least two of the plurality of sensor devices.

In an embodiment, a method of operating a sensor system comprising a plurality of sensor devices arranged proximate one another such that each of the plurality of sensor devices is configured to sense essentially the same condition, each sensor device comprising a plurality of terminals, comprising operating a first sensor device of the plurality of sensor devices in a spinning current mode comprising at least two clock phases by selectively coupling a first terminal of the first sensor device as a supply terminal and a second terminal of the first sensor device as a signal terminal such that, in sequential clock phases, current flows in different directions in at least a portion of the first sensor device and different ones of the plurality of terminals of the first sensor device are the signal terminal; determining a partial spinning current output signal of the first sensor device in each of the at least two clock phases of the operating of the first sensor device; operating at least a second sensor device of the plurality of sensor devices in the spinning current mode; determining a partial spinning current output signal of the at least second sensor device in each of the at least two clock phases of the operating of the at least the second sensor device; and determining a sensor system output signal based on the partial spinning current output signals of the first sensor device and the at least second sensor device.

BRIEF DESCRIPTION OF THE DRAWINGS

The invention may be more completely understood in consideration of the following detailed description of various embodiments of the invention in connection with the accompanying drawings, in which.

Figure 1:
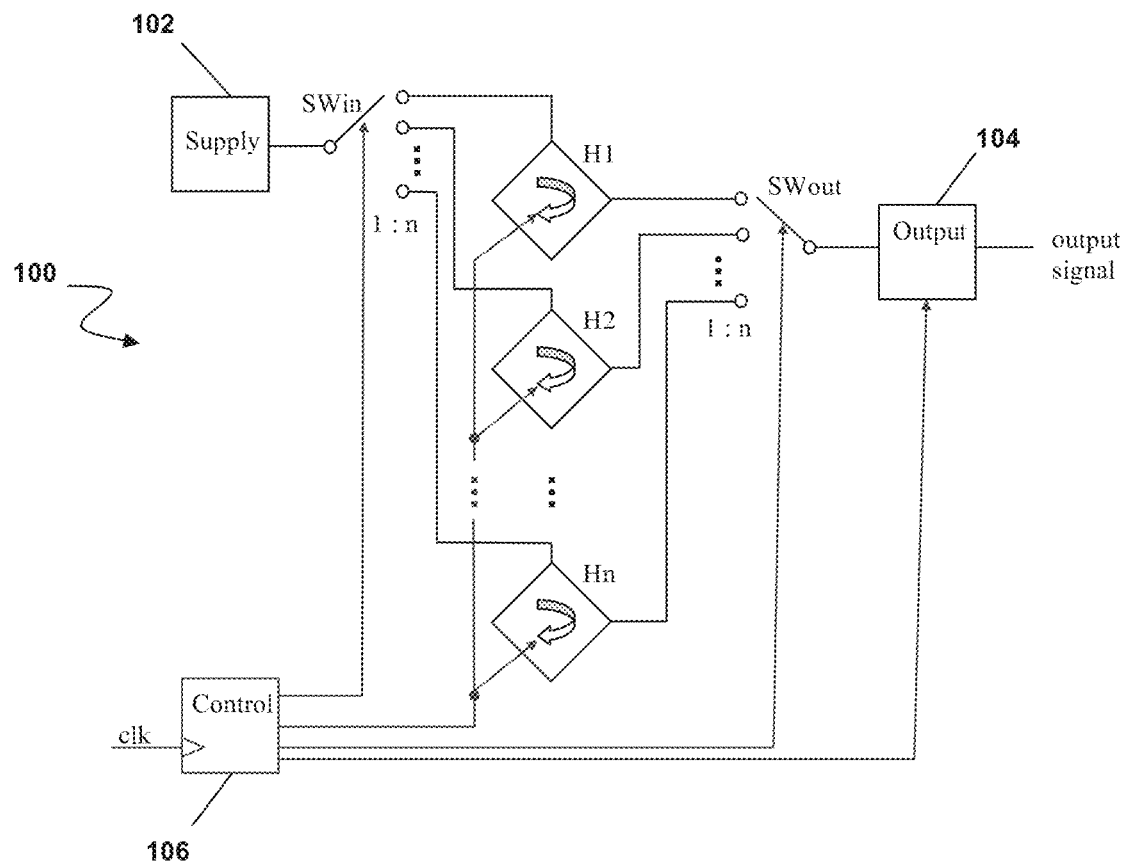
FIG. 1 is a block diagram of a sensor system according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to systems and methods for reducing errors in sensor devices and sensor systems. In embodiments, the sensor devices comprise magnetic field sensor devices, such as ordinary or vertical Hall sensor devices, and the error to be reduced is a residual offset error, though in other embodiments other sensor devices can be used and/or other types of errors can be targeted for reduction or elimination. In one embodiment, at least two such sensor devices are sequentially operated in a spinning current-type mode such that an individual output signal from each of the at least two sensor devices is obtained. A total output signal can then be calculated, such as by averaging or otherwise combining the individual output signals from each sensor device.

Referring to FIG. 1, a sensor system 100 is depicted. Sensor system 100 comprises a plurality of Hall sensor devices H1-Hn in the embodiment of FIG. 1, where n is an integer greater than 1. Embodiments comprising Hall effect sensor devices, whether ordinary or vertical, and directed toward reducing residual offset error in these devices generally will be discussed herein by way of example embodiments but are not to be considered limiting, as embodiments can comprise other sensor types and/or be directed toward reducing or eliminating other types of errors. Moreover, the plurality of sensor devices needs not to be identical with one another, though generally each of the plurality is responsive to the same physical quantity, e.g., a magnetic field component perpendicular to a substrate on which the sensor devices are arranged. The sensor devices H1-Hn are arranged such that each is exposed to essentially the same magnetic field, the difference generally being only related to the small spacing in positioning each device H1-Hn on the substrate, such as about 1 mm or less in an embodiment.

Hall effect sensor devices H1-Hn generally are those comprising at least one active Hall region in which charge carriers have a high Hall mobility and at least three terminals, wherein at least two of the terminals are used as supply terminals to supply the sensor device with electric energy and at least one of the terminals is used as a signal terminal that taps a signal indicative of a magnetic field acting on the active Hall region. One or more of the terminals of the Hall sensor devices can be used as another type of terminal, for example top plates of p-tubs in n-doped active Hall regions or vice-versa, guard rings, isolation rings, or other terminal types. As used herein, however, "terminals" generally refers to supply terminals and/or signal terminals unless otherwise noted.

In embodiments, the Hall effect sensor devices H1-Hn are suitable for being operated in a spinning current sequence comprising at least two spinning current phases, also referred to as clock phases or operating phases, in each of which current flows in different directions through at least a portion of the Hall effect sensor device H1-Hn. In an embodiment, this change in current flow is accomplished by coupling terminals of the Hall effect sensor device H1-Hn differently in each spinning current phase as supply terminals or signal terminals, with the output signals from the at least two clock phases then being combined, such as by adding, averaging, low pass-filtering or some other methodology, in order to obtain an overall spinning current output signal. In embodiments, the Hall effect sensor devices H1-Hn are not electrically coupled with one another, or are coupled by only a single terminal, such as a common ground node. In other words, there is no current flowing between Hall effect sensor devices H1-Hn in embodiments.

In one example of a spinning current sequence, and referring also to FIG. 2 which depicts an example lateral Hall plate with four terminals T1, T2, T3 and T4 and 90-degree symmetry, current flows from T1 to T3 in a first phase and from T2 to T4 in a second phase, T3 to T1 in a third phase, and T4 to T2 in a fourth phase. The output signals then are voltages tapped between T2-T4 in a first phase, between T3-T1 in a second phase, between T4-T2 in a third phase, and between T1-T3 in a fourth phase. There are various possibilities of spinning current schemes available in embodiments. A simple spinning current scheme is known as an orthogonal scheme, whereby only phases 1 and 2 are used, and the signals of phases 1 and 2 are added to provide a spinning current output signal. In real devices, the 90-degree symmetry is generally not perfect and therefore at zero magnetic field the signal at each operating phase is non-zero. This is referred to as the raw offset of the respective phase. The addition of the raw offsets of phases 1 and 2 is equivalent to the offset of the spinning current output signal in the orthogonal scheme and the residual offset of the overall spinning current scheme. It can be measured in equivalent magnetic units by dividing the output signal measured in volts by the magnetic sensitivity measured in volts per Tesla. The residual offset typically is much smaller than the raw offset (e.g., on the order of about 100× smaller).

The same procedure can be carried out in phases 3 and 4 with similar results. The spinning current scheme can include all four phases, and in practice it can be shown that the residual offset of this four-phase spinning current scheme is, on average, smaller than the residual offset of any two-phase spinning current scheme. In some cases, however, the residual offset of a two-phase spinning current scheme can be smaller than the residual offset of a four-phase spinning current scheme. Presumably this depends on the exact nature of the asymmetry that causes the offset. Therefore, in some embodiments large spinning current schemes composed of a large number of phases can be split up in order to determine a multitude of spinning current output signals of partial spinning current schemes, with the smallest possible number of phases generally being two, and then the distribution of all these partial spinning current output signals observed and algorithms applied to them in order to reduce the residual offset.

The output signal can also be current instead of voltage in embodiments. To this end, in phase 1 as described above a voltage source can be connected to T1 and T3, and an ammeter connected between T2 and T4. The current measured by the ammeter is the output signal of the phase. An ammeter provides a galvanic short between T2 and T4, yet it can be replaced by various types of circuits that use feedback techniques and high open loop gain to establish a virtual short between T2 and T4, such as is described in co-owned and co-pending U.S. patent application Ser. No. 13/627,468, which is incorporated herein by reference in its entirety. This application also discusses other spinning current schemes relating to triangular Hall plates. For example, a Hall plate having three terminals T1, T2 and T3 arranged in a clockwise direction around the perimeter can be operated in a three-phase spinning current scheme. In phase 1, T1 and T2 are coupled to a voltage source, and T3 is coupled to a reference potential. The output signal in this phase is the difference in currents flowing into T1 and T2. In phase 2, T2 and T3 are coupled to a voltage source, and T1 is coupled to a reference potential. The output signal in this phase is the difference of currents flowing into T2 and T3. In phase 3, T3 and T1 are clamped to a voltage source, and T2 is clamped to a reference potential. The output signal in this phase is the difference of currents flowing into T3 and T1. Here all three terminals can be regarded as supply terminals in all three clock phases, and the two terminals coupled to the voltage source are simultaneously signal terminals. Moreover, T2 is a signal terminal in phases 1 and 2 but not in phase 3, such that a signal terminal does not change in every operating phase, just in some phases, in embodiments.

Additionally, signals can be tapped between two Hall effect devices or between two tubs of a Hall effect device. Put another way, each Hall effect sensor device H1-Hn can comprise a single Hall effect sensor device or a plurality of Hall effect sensor devices coupled with one another to form a compound Hall effect sensor device. One example of such a coupling arrangement can be seen in FIG. 3 of commonly owned U.S. patent application Ser. No. 13/559,197, which shows couplings arrangements of two multi-contact sensor devices in multiple phases. In particular, two sensor devices which are isolated from one another but have a common ground node each have three contacts in the embodiment depicted and are each supplied with a dedicated current from a current source, such that the output signal is the voltage between the third terminal of the first device and the first terminal of the second device. Thus, there is a single output signal obtained by a voltage measurement between terminals of the two sensor devices, such that the two sensor devices can be considered to form one Hall sensor device having one output signal. In embodiments, one or more of the Hall effect sensor devices H1-Hn can be such a compound device, while one or more others are single Hall effect sensor devices. U.S. patent application Ser. No. 13/559,197 is incorporated herein by reference in its entirety.

In embodiments, partial spinning current schemes can comprise three instead of only two operating phases. For example, two vertical devices each comprising four terminals can be operated at least in twenty-seven phases in embodiments, and some of these phases can be grouped in partial spinning current schemes having only two signals while other partial spinning current schemes have four.

Figure 2A:
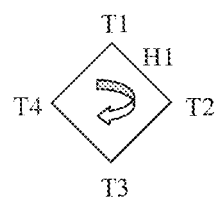
FIG. 2A is a top view of a planar Hall effect sensor element according to an embodiment.
Figure 2B:
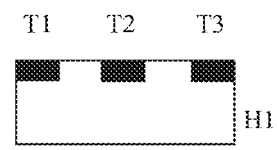
FIG. 2B is a cross-sectional view of a vertical Hall effect sensor element according to an embodiment.

Returning to FIG. 1, each sensor device H1-Hn is coupleable by an input switch SWin to an electrical supply 102, such as a voltage or current supply. Each sensor device H1-Hn also is coupleable by an output switch SWout to signal processing and sensor output circuitry 104. Sensor system 100 as depicted in FIG. 1 is somewhat simplified, in that each sensor device H1-Hn is shown having only one supply terminal and one output terminal, and those skilled in the art will appreciate that, generally, at least two supply terminals and at least one though in many cases two output terminals can be used for each sensor device H1-Hn. Refer, for example, to FIG. 2A, which depicts a planar Hall sensor device H1 having four terminals T1, T2, T3 and T4. The rotational arrow signifies that sensor device H1 is a spinning Hall probe and comprises or is otherwise associated with appropriate switches and circuitry necessary to operate device H1 in a spinning current scheme. FIG. 2B depicts a cross-section of a vertical Hall sensor device H1 comprising three terminals T1, T2, T3 accessible from a top surface of the substrate. While conventional or planar Hall devices, such as is depicted in FIG. 2A, are sensitive to magnetic fields perpendicular to the surface plane of the device, vertical Hall devices like the one depicted in FIG. 2B are sensitive to magnetic fields parallel to the surface plane of the device.

Sensor system 100 also comprises a clock clk coupled to input switch SWin and each sensor device H1-Hn by control circuitry 106. Clock clk drives control circuitry 106, which in turn implements a spinning current-like mode of operating sensor devices H1-Hn by controlling which terminals are coupled with supply 102 by input switch SWin and with output circuitry 104 by output switch SWout. Clock clk also controls the operating phase of each sensor device H1-Hn as well as output circuitry 104, though these features can be optional in embodiments and can relate in some embodiments to the type of sensor H1-Hn used, i.e., spinning current Hall effect devices can rely on the signal of clock clk derived from control circuitry 106.

In embodiments, control circuitry 106 determines not only the time-wise sequence or order in which sensor devices H1-Hn are operated but also the temporal relationship between those operations. For example, control circuitry 106 can determine whether operation of any of sensor device H1-Hn overlaps with any other, does not overlap with any other, or skips or disregards operation of any particular sensor device(s) H1-Hn.

For example, control circuitry 106 can control input switch SWin to couple sensor device H1 to supply 102 during a first time interval, and can control output switch SWout to couple sensor device H1 with output circuitry 104 during some or all of the same time interval. During a second time interval, control circuitry 106 can control input switch SWin to couple sensor device H2 to supply 102 and to sensor readout circuitry via output switch SWout during the same second time interval, again for some or all of that time interval. This process can repeat for some or all of sensor devices up to and including sensor device Hn in an n-th time interval. In embodiments, these time intervals are sequential or successive, though in other embodiments the time intervals can be interleaved or overlapping. For example, a sensor device H1 can be operated in a first clock phase of its spinning current mode, then sensor device H2 can be operated in a first clock phase of its spinning current mode, followed by sensor device H1 being operated in a second clock phase of its spinning current mode, then sensor device H2 being operated in a second clock phase of its spinning current mode, for a total of four clock phases. This is but one example of an interleaving, and other methods of interleaved operation can be used in other embodiments.

In another embodiment, for example, control circuitry 106 controls input switch SWin to couple sensor device H1 to supply 102 and output switch SWout to couple sensor device H1 with output circuitry 104 such that sensor device H1 is operated in a spinning current sequence comprising at least two operating modes in which the terminals of H1 are variously coupled as supply terminals, signal terminals and/or other terminals. Then, control circuitry 106 controls input switch SWin to couple sensor device H2 to supply 102 and output switch SWout to couple sensor device H2 with output circuitry 104 such that sensor device H2 is operated in a spinning current sequence comprising at least two operating modes in which the terminals of H2 are variously coupled as supply terminals, signal terminals and/or other terminals. This process continues for each sensor device through sensor device Hn.

In embodiments, output circuitry 104 comprises circuitry configured to collect output data from each of sensor devices H1-Hn when coupled thereto. In an embodiment, the memory circuitry can comprise sample-and-hold circuitry, a shift register, a low-pass filter that integrates over the n time intervals, or some other suitable circuitry configured to carry out the memory function.

As previously mentioned, offset error can relate to different causes, two of which are raw offset error and residual offset error. Raw offset error can refer to an offset error present in a particular operating phase, whereas residual offset error can refer to an offset error present in an overall or total output signal, such as a signal which is a combination of those from individual operating phases of a particular Hall effect device. Therefore, raw offset errors in multiple operating phases can be combined to create either an increased residual offset error, which is undesired, or to partially or completely cancel raw offset errors such that the residual offset error is reduced or eliminated. In embodiments, sensor readout circuitry 104 is configured to reduce or eliminate this residual offset error by using the individual output signals from each of H1-Hn and combining or otherwise analyzing them in some way.

Thus, in embodiments output circuitry 104 comprises circuitry configured to implement one or more algorithms that take as inputs the output signals of H1-Hn, evaluates those signals in some way, and produces an overall output signal related thereto. In one embodiment, all partial spinning current output signals are sampled at the same time, their distribution is compared, a best guess for a magnetic field that would cause such a distribution is derived, outliers are identified (if any), and actions regarding how to cope with the devices or the respective partial spinning current schemes that caused these outliers in future are determined and implemented. Challenges, however, can exist in implementing such a scheme.

For example, it may not be possible to sample all partial spinning current schemes simultaneously, because some of them (e.g. of the same Hall effect device) can interfere with each other or system resources can be lacking, such as not enough current available to power up all Hall effect devices and signal conditioning circuitry simultaneously. One solution to this is to carry out all operating phases very quickly compared to all other transients in the system. Another solution can be to scramble some clock phases so that the partial spinning current schemes are arranged in a time-interleaved manner. A more sophisticated approach is for the system to estimate the time-related evolution of an applied magnetic field, and optionally other quantities that influence the measurements such as temperature, mechanical stress, and supply voltage of the sensor, using robust methods. For example, the system can simply add up all partial spinning current output signals of all Hall effect devices in one embodiment. Whenever it identifies stable environmental conditions (i.e., sufficiently stable applied magnetic field, temperature, mechanical stress, supply voltage, and/or other quantities), the system can acquire the distribution of partial spinning current output signals and presume they are valid. On the basis of this valid distribution, the system can infer which partial spinning current output signals are outliers or less reliable. While the distribution of partial spinning current output signals is typically available because it is already determined in order to sum up all signals, only when the system detects stable conditions does it evaluate this distribution and freeze the result for future decisions on how to operate all Hall effect devices in embodiments.

In practice, each partial spinning current scheme can suffer from a small offset error, yet it also can suffer from a small gain error. Moreover, for asymmetric devices like most types of vertical Hall effect devices, the gain or magnetic sensitivity is not identical for all partial spinning current schemes. Therefore, it could be problematic to compare the partial spinning current output signals for an arbitrary applied magnetic field. Instead, it could be advantageous to compare them at a small applied magnetic field. Similar to the system discussed in the previous example, this embodiment also can make a rough estimation of applied magnetic field with robust methods and take the observed distribution of partial spinning current output signals valid if the magnitude of the applied field is low enough, such as below about 100 μT in one embodiment. At such low fields the gain mismatch of various devices and partial spinning current schemes has only a small effect on the observed distribution. Moreover, the system can use the estimated magnetic field to account at least for systematic differences in magnetic sensitivity of various partial spinning current schemes.

Embodiments also can address how to treat partial spinning current output signals that have been identified as outliers. In one embodiment, these signals simply can be skipped or disregarded, which means that these signals are not used to derive the total output signal. A more refined approach in another embodiment is to multiply them with a smaller weighing factor than all others, so that their influence on the output signal decreases. In this case the system updates the weighing factors of all of the partial spinning current output signals whenever it identifies a new valid distribution of partial spinning current output signals. Thereby, the weighing factors of the signals that are close to the mean of the distribution are slightly increased, whereas the weighing factors of the signals that are outliers (i.e., distant from the mean of the distribution) are slightly decreased. The weighing factors can be normalized, which means that the sum of all weighing factors remains constant so that the overall magnetic sensitivity of the sensor remains constant. Moreover, weighing factors should not be negative in embodiments, as ideally they should be limited between a minimum and a maximum value, typically between 0 and 1, though this can vary in embodiments.

Embodiments also can address how the system treats partial spinning current schemes whose output signals were identified to be outliers. In one embodiment, these schemes can be omitted from some or all future spinning current schemes, which means the respective sensor devices are not operated. This can save the power needed to operate those devices as well as the time needed to operate those devices and sample their signals. If the above-explained weighing factors are used, the system can define minimum values for them, below which the respective partial spinning current scheme is omitted. For example, if a system has four Hall effect devices, each one operable in two partial spinning current phases, there are a total of eight partial spinning current phases. Each spinning current output signal can be multiplied by a weighing factor prior to summation. If all spinning current output signals are good, then their distribution with zero applied field is narrow. Then, the weighing factors should be 0.125=1/8.

After some time, however, one spinning current output signal can start to drift away from the distribution at zero applied field, such that then its respective weighing factor should be decreased by the system, for example to 0.1. However, the respective partial spinning current scheme is still executed in the same manner as all others. If the trend continues and after some time this spinning current output signal is far from the mean of the distribution, the system can continue to reduce its weighing factor to some minimum value, such as 0.05 in an embodiment. If it is assumed that the minimum value for each weighing factor is defined to be 0.05, then the system omits the respective partial spinning current scheme during subsequent operation and sets its weighing factor to zero, such that it no longer has any influence on the summation of partial spinning current output signals.

Signals which are identified as outliers, however, may not always be so, though in the simplest case the status of an outlier does not change once the system has detected an outlier, such that it omits its partial spinning current scheme permanently. In other embodiments, however, the system can check to see whether any outliers have improved. To this end the system can simply begin executing the respective partial spinning current scheme while keeping its weighing factor at zero, such that its partial spinning current output signal does not affect the total output. If the system detects stable environmental conditions, it can mark the distribution of partial spinning current output signals as valid and evaluate the distribution. If the previously identified outlier remains off of the mean of the distribution, then the situation has not improved and it remains an outlier until the next check. If, however, the past outlier is now closer to the distribution, its weighing factor can be increased above the minimum value such that for future spinning current cycles it will be operated.

In embodiments, all outliers can be operated again if the system detects a large magnetic field, because the outliers may only be effective at low applied magnetic field. Large changes in temperature, mechanical stress, or supply voltage also can trigger the system to begin operating all outliers again, such as by setting their weighing factors above the minimum value.

The number of outliers can be compared to a limit value by the system in embodiments. If too many outliers are identified, the system can issue a warning indicating that its reliability to detect small magnetic fields is impaired. For example, if a system has ten partial spinning current schemes implemented, then it can detect one, two or three. If, however, five of the schemes produce outliers in the distribution of partial spinning current output signals, then it can become difficult to determine which are outliers and which are accurate. The situation can become worse when more than half of the partial spinning current signals are outliers, because then the system could judge the outliers to be good, and vice versa. Thus, in embodiments, results can be improved when only a minority of partial spinning current schemes are outliers, such that it can be beneficial to provide an alert when this is no longer the case. The system also can detect if all partial spinning current output signals at zero applied field of a certain Hall effect device are outliers, as it could be the situation then that this specific Hall effect device has a problem or defect. The system can communicate this type of error and an identifier for the respective Hall effect device to indicate that the system has reduced reliability, at least at low magnetic field.

Thus, and referring to FIG. 1, in one embodiment output circuitry 104 can simply sum or average the individual output signals of H1-Hn to provide an overall output signal. In another embodiment, output circuitry 104 determines the spinning current output for each of H1-Hn by combining the individual spinning current outputs of each, thereby effectively determining the residual offset of each of H1-Hn, and then derives an overall output signal from the output determined for each of H1-Hn. In other embodiments, output circuitry 104 can provide as an overall output signal a statistical indicator related to an evaluation of the individual output signals of H1-Hn. For example, in embodiments the overall output signal can be or relate to a median, standard deviation, variance, kurtosis, skew, or any other value or indicator related to the signals.

In one particular example, output circuitry 104 can determine whether the sensed magnetic field has a small (e.g., less than about 100 µT) or large (e.g., greater than about 100 µT) magnitude, and then process the signals differential based on this determination. For example, signals greater than about 100 µT, output circuitry 104 can implement an algorithm which takes the average of the output signals of all of sensor devices H1-Hn, whereas for those less than about 100 µT circuitry 104 can eliminate outlying values. In embodiments, output circuitry also can use a graded transition between the ranges, which can be other than this example provided here in other embodiments, by determining both values and deriving a total output signal therefrom, such as according to $X^*f(best)+Y^*(1-f(best))$, where X is the combination of signals at the large field (e.g., greater than about 100 µT) and Y is the combination of signals at the small field (e.g., less than about 100 µT), best is an estimated magnetic field, and f(best) is a smoothing function assuming values between 0 and 1 with $f(0)=0$ and $f(infinity)=1$, and a steep slope near best=100 µT.

Output circuitry 104 can also identify outliers, such as whether signals in particular clock phases or from a particular sensor device H1-Hn are outlying with respect to others, and rank and/or store this information in volatile or non-volatile memory. Based upon this information, output circuitry 104 can determine how to control devices H1-Hn in subsequent operating phases via control circuitry 106. Output circuitry 104 also can issue a warning, such as by setting an alert flag in a register that can be communicated to other components within or outside of system 100, which indicates that a certain percentage of sensor devices H1-Hn are underperforming or are underperforming by a certain amount. Output circuitry 104 also can provide additional information, such as a second output signal, with respect to the distribution or spread of signals of sensor elements H1-Hn. To this end, output circuitry 104 can compute the standard deviation or the difference between maximum and minimum values obtained by H1-Hn or similar alternatives. The data can be stored, such as in a register, and communicated periodically, upon external request, or outputted continuously, in embodiments.

In embodiments, output circuitry 104 can use output signals of H1-Hn for the last n time intervals, additional and/or older time intervals, information retained such as from end-of-line testing during manufacturing or some other source, or from some other source or period. Thus, output circuitry 104 can take into consideration, or not, potential lifetime changes or other factors which can affect any of H1-Hn in operation and use.

Consider, for example, an embodiment in which sensor system 100 comprises nine sensor devices H1-H9, each of which comprises four terminals. Sensor devices H1-H9 are operated individually in spinning current-type modes in which the supply and signal terminals of each device are variously switched. Referring to FIGS. 1 and 2, if the top terminal of sensor device H1 is considered terminal 1, T1, and subsequent terminals are numbered 2-4 in a clockwise direction, four spinning current phases can be operated in which current flows from T1 to T3 in a first phase, from T2 to T4 in a second phase, from T3 to T1 in a third phase, and from T4 to T2 in a fourth phase. Correspondingly, output voltages are then measured between T4 and T2 in the first phase, T1 and T3 in the second phase, T2 and T4 in the third phase, and T3 and T1 in the fourth phase. An output signal for H1 can be calculated from these four output voltages, such as by averaging the voltages. Similarly, output signals for each of H2-H9 can be obtained. If there is a large offset error (i.e., an obvious outlier) in any output signal of any particular sensor device H1-H9, it is largely reduced or eliminated, such as by a factor of nine in this example embodiment having nine sensor devices in which an error, such as a significant error, is related to one value, through the operation of the individual device in a spinning current mode and the subsequent combination of the output signals from each sensor device H1-H9. In another example, the offset error can be reduced by a factor of three, on average in embodiments, when there are nine values, each having a small statistically independent error.

In a variation on this example, sensor devices H1-H9 can be operated simultaneously in their spinning current-type modes. Such an operating mode will be much faster from a signal processing perspective but will also consume more current. Thus, embodiments comprising successive operating modes of each sensor device H1-Hn can be advantageous, though those skilled in the art will appreciate that some applications can be benefited by other operating modes contemplated by embodiments.

As previously mentioned, output circuitry 104 also can carry out other analyses of the output signals of sensor devices H1-Hn and take the result into consideration when controlling operation of devices H1-Hn by control circuitry 106. For example, in one embodiment output circuitry 104 can determine a distribution of residual offset between or among sensor devices H1-Hn. Any devices which are outliers, such as those having particularly high residual offset, can then be identified and output signals from those devices disregarded in order to improve the overall output signal. In embodiments, whether the residual offset of any particular sensor device H1-Hn is high or not can be determined with respect to others of the sensor devices H1-Hn or some percentage or other predetermined value.

For example, in an embodiment system 100 comprises five sensor devices H1-H5. In operation, output circuitry 104 determines the spinning current output of each to be as follows: H1=−2 µT; H2=−10 µT; H3=50 µT; H4=15 µT; and H5=10 µT. The outliers on either end are H2 and H3, which can be disregarded from the calculation of the overall output signal. In this example, the overall output signal calculated from H1, H4 and H5 is 7.7 µT, compared with the overall output signal calculated from all five H1-H5 being 12.6 µT, which represents a 64% improvement in the residual offset. In other embodiments, whether an outlier is eliminated can depend on a variety of factors, such as a percentage difference from a mean, median or other value, a raw difference from the next closest value, a simple number of devices to be considered, or some other factor(s).

In embodiments, output circuitry 104 also can maintain a history of performance of any of the sensor devices H1-Hn, such that any that consistently demonstrate high residual offset or other error can automatically be omitted, such as by removing them from the spinning current mode. For example, if sensor device H2 consistently underperforms with respect to the other sensor devices H1 and H3-H5, control circuitry 106 can remove sensor device H2 from the sequence of sensor devices in operation. In this way, system 100 can adapt to the realities of some modern sensor devices, in which most are quite good but occasional outliers with high offset can be identified and eliminated easily. This can save time and improve the efficiency and accuracy of system 100 in embodiments. System 100 also can determine in operation, in the field, which sensor device(s) H1-Hn are outliers, are more or less affected by temperature drift, or are otherwise underperforming. As such, system 100 can adjust for changes that occur post-manufacturing, including drift in individual sensor devices H1-Hn over the life of system 100 in use. Any sensor devices H1-Hn removed from operation can be periodically evaluated, as changes in sensor devices H1-Hn throughout the operational lifetime of those devices could affect whether a device continues to be removed or implemented. For example, outlying devices can be identified every 100 cycles and omitted for the following 99 cycles, then reevaluated in the $200^{th}$ cycle, or according to some other evaluation scheme. Additionally, sensor devices H1-Hn can be tested in end-of-line testing during manufacturing, with any outlying sensor device(s) H1-Hn identified and programmed into memory of system 100 such that those devices are automatically disregarded in use in embodiments. Disregarding of any sensor devices H1-Hn can take several forms, such as by ignoring any output signal from those devices, or not even selecting those devices by control circuitry 106 in operation, in embodiments.

For example, one or more of sensor devices H1-Hn can exhibit temperature drift, such that H2 has a higher offset at low temperatures while H3 has higher offset at high temperatures. This information can be used in several different ways. In one embodiment, it can be determined which temperature or temperature range is more important, and the sensor device exhibiting higher offset in that range can be deselected or its output signal ignored. In another embodiment, an algorithm can be implemented by output circuitry 104 which takes both outputs into account and implements a temperature function such that the relevant sensor device (s) H1-Hn can be omitted at higher or lower temperatures, as appropriate.

Another advantage of embodiments is that system 100 need not know the exact applied magnetic field in order to identifier outliers or otherwise reduce residual offset. If an external magnetic field is acting on system 100, that field would shift the signals of sensor devices H1-Hn but not change whether any sensor device H1-Hn is an outlier. Moreover, yet another advantage of embodiments is the ability to detect transient magnetic fields affecting any of sensor devices H1-Hn by sequentially operating each of sensor devices H1-Hn and repeating the measurements, then determining whether the samples of each sensor device are similar, in which case any transient field was seemingly stable, or more disparate, in which case the transient field seemingly changed.

Embodiments also can provide safety advantages, such that system 100 can detect if any individual sensor device(s) H1-Hn are malfunctioning or defective. In an embodiment, output circuitry 104 can compare maximum and minimum signals of all sensor devices H1-Hn and provide a system warning if a difference or ratio between the two exceeds some maximum tolerated value.

Figure 3:
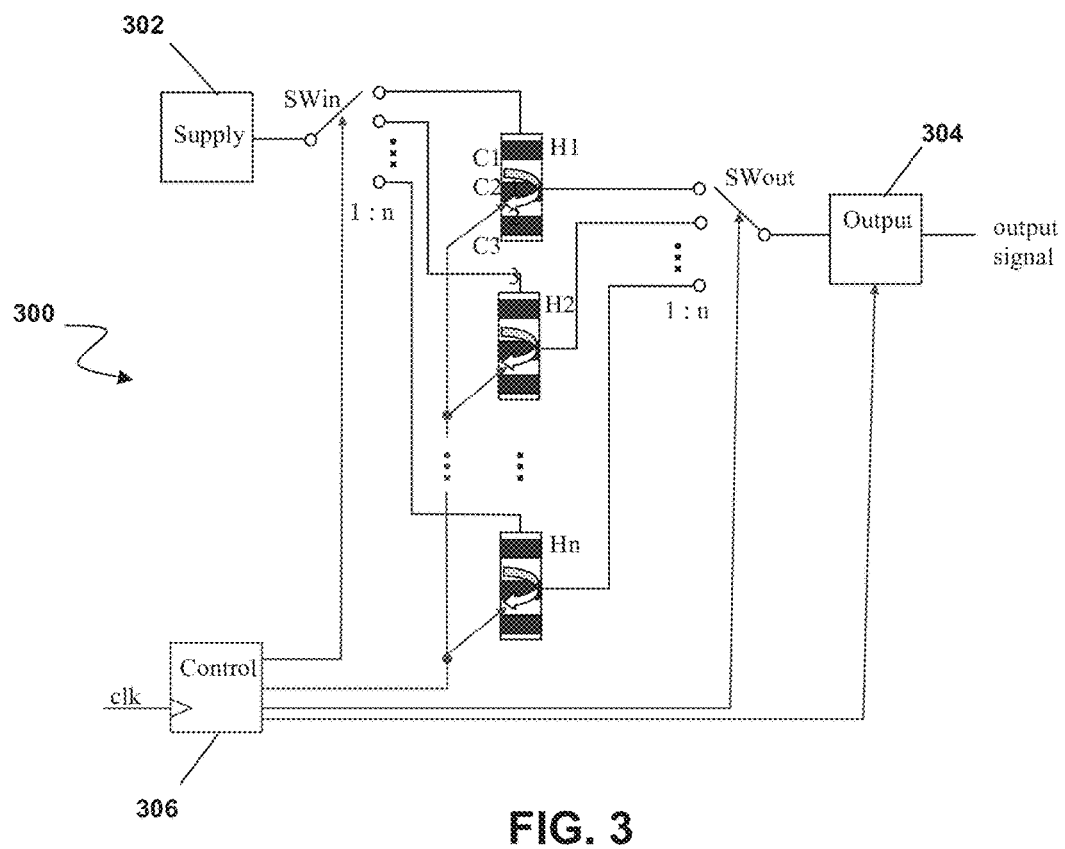
FIG. 3 is a block diagram of a sensor system according to an embodiment.

Variations of system 100 are also contemplated in embodiments, such that other and/or additional features and advantages can be provided. Referring to FIG. 3, and as previously mentioned, in embodiments sensor system 300 can comprise sensor devices H1-Hn which are vertical Hall devices. While conventional or planar Hall devices, such as those discussed above with reference to FIGS. 1 and 2, are sensitive to magnetic fields perpendicular to the surface plane of the device, vertical Hall devices are sensitive to magnetic fields parallel to the surface plane of the device. In FIG. 3 and herein throughout, similar reference numerals are used to refer to similar elements in the drawings, e.g. control circuitry 106 in FIG. 1 and control circuitry 306 in FIG. 3, output circuitry 104 in FIG. 1 and output circuitry 304 in FIG. 3, etc. Features, functionality and other characteristics therefore should be considered to be similar or the same unless otherwise indicated. Vertical Hall devices H1-Hn of system 300 can provide advantages with respect to their smaller size as compared with conventional Hall plates, and embodiments can be particularly beneficial given that vertical Hall devices typically suffer from larger residual offset errors.

Figure 4:
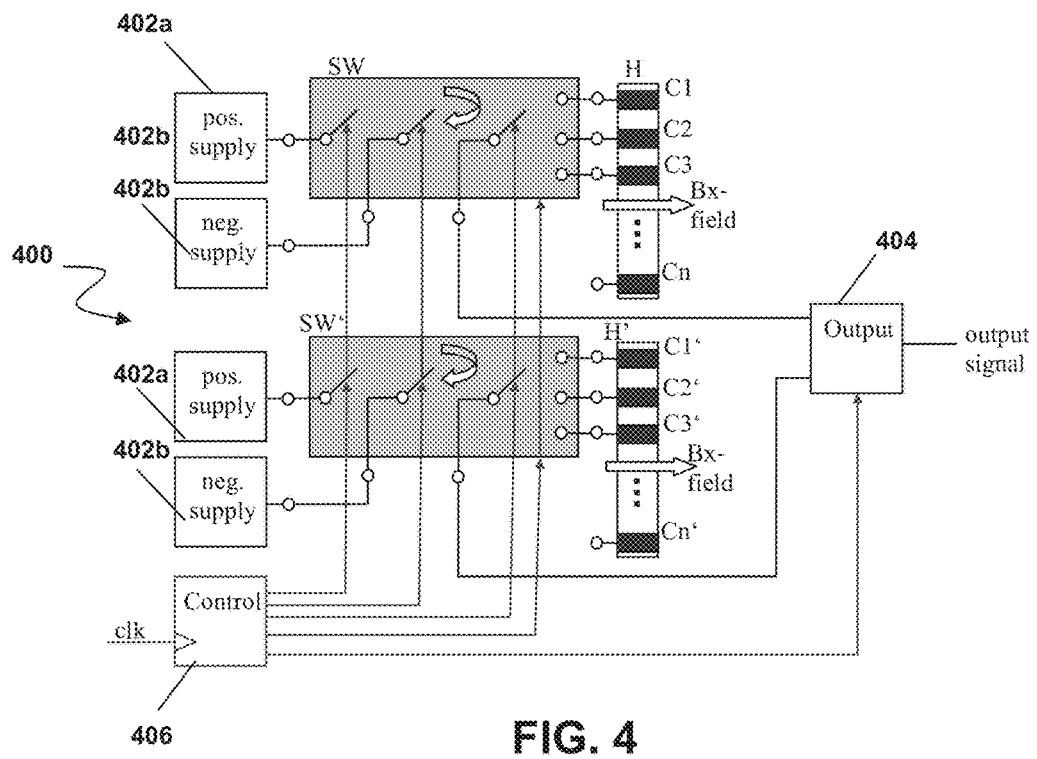
FIG. 4 is a block diagram of a sensor system according to an embodiment.

In the embodiment of FIG. 3, sensor system 300 comprises a plurality of vertical Hall sensor devices H1-Hn. Each vertical Hall sensor device H1-Hn comprises three terminals as depicted, though the number of terminals can vary in other embodiments. For example, in the embodiment of FIG. 4, each vertical Hall sensor device H and H' comprises a plurality of terminals C1-Cn, a configuration which is equivalent to individual vertical Hall sensor devices being combined. In an example embodiment in which n=6 such that vertical Hall sensor device H comprises terminals C1-C6 each evenly spaced, terminals C1-C3 can be considered to comprise a first vertical Hall sensor device, terminals C2-C4 can be considered to comprise a second vertical Hall sensor device, terminals C3-C5 can be considered to comprise a third vertical Hall sensor device, and terminals C4-C6 can be considered to comprise a fourth vertical Hall sensor device. The devices need not be comprised of sequential contacts. For example, a first device can comprise terminals C1-C3 which a second device can comprise terminals C5-C7, a third device terminals C2-C4, and so forth, though this again is only one example embodiment. In general, however, any device comprises three sequential terminals, rather than configurations such as C1, C3 and C5.

An advantage of system 400 is that devices H and H' require less space than if four separate vertical Hall devices were implemented without sharing terminals. Though terminals C1-Cn are shared between devices in such an embodiment, the residual offset experienced by any particular device can be relatively independent.

To accommodate such a configuration, sensor system 400 comprises two switching circuitries SW and SW' to variously couple each vertical Hall sensor device H and H' with positive and negative power supplies 402a and 402b and output circuitry 404. Each switching circuitry SW and SW' comprises a plurality of switches, such as three as depicted, to couple the three contacts of each sensor device with a positive power supply 402a, a negative power supply 402b and output circuitry 404. Similar to other embodiments, control circuitry 406 controls the operation of switching circuitry SW and SW' with respect to which terminals C1-Cn of each vertical Hall sensor device H and H' are coupled in a spinning current-type mode of operation.

In embodiments, sensor systems 300 and 400 are each operated in spinning current-type modes, in which the coupling arrangement of the terminals of a particular sensor device are altered in sequential operating phases. For convenience, sensor system 300 will be referred to here as an example embodiment, but the same or similar spinning current-type modes can be implemented using sensor system 400. In operation, the coupling arrangement of the terminals of each of H1-Hn, referred to herein as terminals C1, C2 and C3 from top to bottom on each sensor device H1-Hn, are varied among power supply 302, output circuitry 304 and a reference potential, such as ground or some other potential.

For example, in a six-phase spinning current mode or scheme, in a first operating or clock phase C1 of vertical Hall sensor device H1 is coupled to power supply 302 by SWin, C2 is coupled to a reference potential, and C3 is coupled to output circuitry 304 by SWout. In a second phase, C1 is coupled to output circuitry 304, C2 is coupled to power supply 302, and C3 is coupled to a reference potential. In a third phase, C1 is coupled with coupled with output circuitry 304, C2 is coupled to a reference potential, and C3 is coupled to power supply 302. In a fourth phase, C1 is coupled with a reference potential, C2 is coupled with power supply 302, and C3 is coupled with output circuitry 304. In a fifth phase, C1 is coupled with power supply 302, C2 is coupled with output circuitry 304, and C3 is coupled with a reference potential. In a sixth phase, C1 is coupled with a reference potential, C2 is coupled with output circuitry 304, and C3 is coupled with power supply 302. This can then be repeated in the same or a similar manner for the remaining sensor devices H2-Hn being used. This is but one example of a spinning current mode of operation, and in other embodiments the particular terminal couplings, the order of phases, the total number of phases, and other characteristics can vary, as appreciated by those skilled in the art.

A similar spinning current mode of operation also can be implemented for sensor system 400 using switching circuitries SW and SW' and the three switches, in this embodiment, of each. Each individual switch can couple any terminal C1-Cn, but in general no terminal C1-Cn should be coupled with more than one switch of either SW or SW' in embodiments. Output circuitry 404 determines an output signal for each sensor device, referring here to the discussion above regarding a first device of terminals C1-C3, a second device of terminals C2-C4, and so forth, controlled by control circuitry 406 coupled with each switching circuitry SW and SW', with both SW and SW' implementing similar spinning current schemes such that a differential signal can be obtained between the two devices, one from sensor device H and one from sensor device H', as the individual output signal for that phase. The total number of phases implemented can vary in embodiments, as previously discussed with respect to sensor system 300. For example, two, four or six phases could be implemented, or some other number of phases.

An overall output signal then can be determined from the individual differential signals obtained in each phase. The overall output signal can be a sum, average or other statistical value of the signals of all of the sensor devices in all operating phases as discussed above. Alternatively, output circuitry 304 can combine the spinning current signals by computing their sum, average or other statistical value as discussed above. Thus, it can be advantageous to compute the spinning current signal in several steps, such as by combining the signals of a first two of the six phases, a second two of the six phases, and a third two of the six phases in one example. This provides three signals which are equal in an ideal case; if they differ by a certain amount, outliers can be dropped from the calculation. Alternatively, these three signals can again be combined in any of the above-discussed ways (e.g., sum, average, trimmed mean, quartiles or percentiles, or some other statistical data processing).

Figure 5:
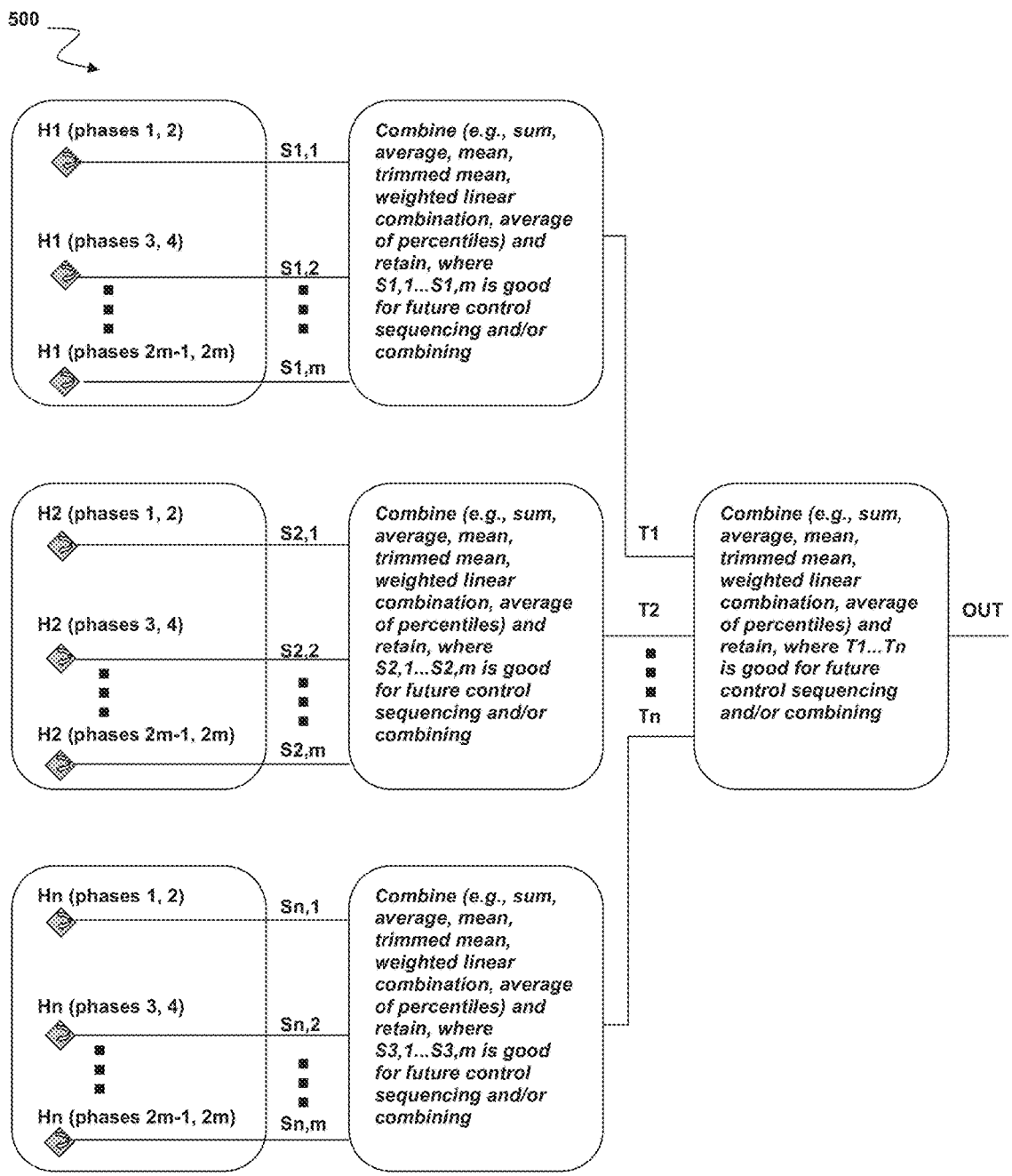
FIG. 5 is a flow diagram for a sensor system according to an embodiment.

For example, and referring to FIG. 5, in one embodiment a system 500 comprises n Hall effect devices, H1-Hn. Each Hall effect device H1-Hn can be operated in m operating phases of a spinning current scheme. The number m can depend in embodiments on the number of terminals of the Hall effect devices H1-Hn, because it is simply the number of possible combinations of supply terminals. If all Hall effect devices H1-Hn have the same number of terminals, they can all be operated in the same number of operating phases. For example, a three-terminal Hall effect device can be operated in m=6 operating phases, a four-terminal Hall effect device can be operated in m=12 operating phases, and so on. In FIG. 5, it is assumed that m is equal for H1-Hn, though in the most general case m can depend on the specific Hall effect device being used (thus m could be indexed $m_i$ for $H_i$). The signals $S_{i,j}$ are called partial spinning current output signals of Hall effect device number i.

FIG. 5 depicts a simple case of a partial spinning current scheme, one which is composed of only two operating phases. For some types of Hall effect devices, partial spinning current schemes with two and three operating phases are also known. In FIG. 5, the partial spinning current schemes of a single Hall effect device are typically not executed simultaneously in embodiments, though this can vary. Thus the partial spinning current scheme comprising phases 1 and 2 of Hall effect device H1 is typically not executed at the same time as the partial spinning current scheme of phases 3 and 4 of Hall effect device H1. However, in rare cases (e.g. when the terminals used in both partial spinning current schemes are sufficiently decoupled, such as by a large distance) there can be an overlap in time of both partial spinning current schemes. Moreover, it is also possible to split up the partial spinning current schemes in individual phases, scramble them arbitrarily, and reconstruct the signals $S_{i,j}$, afterwards. In this case the partial spinning current schemes are executed in a time-interleaved manner. Conversely, the operation of Hall effect device H2 can be done entirely or partially simultaneously or fully sequentially with the operation of Hall effect device H1 in various embodiments.

The combination of partial spinning current output signals $S_{i,j}$ (j=1, 2, . . . m) provides a spinning current output signal $T_i$. Thus, system 500 can evaluate the distribution of partial spinning current output signals $S_{i,j}$ in a first step and derive the spinning current output signals $T_i$ thereof. In a second step, system 500 can evaluate the distribution of spinning current output signals $T_i$ and derive the overall output signal OUT thereof.

Figure 6:
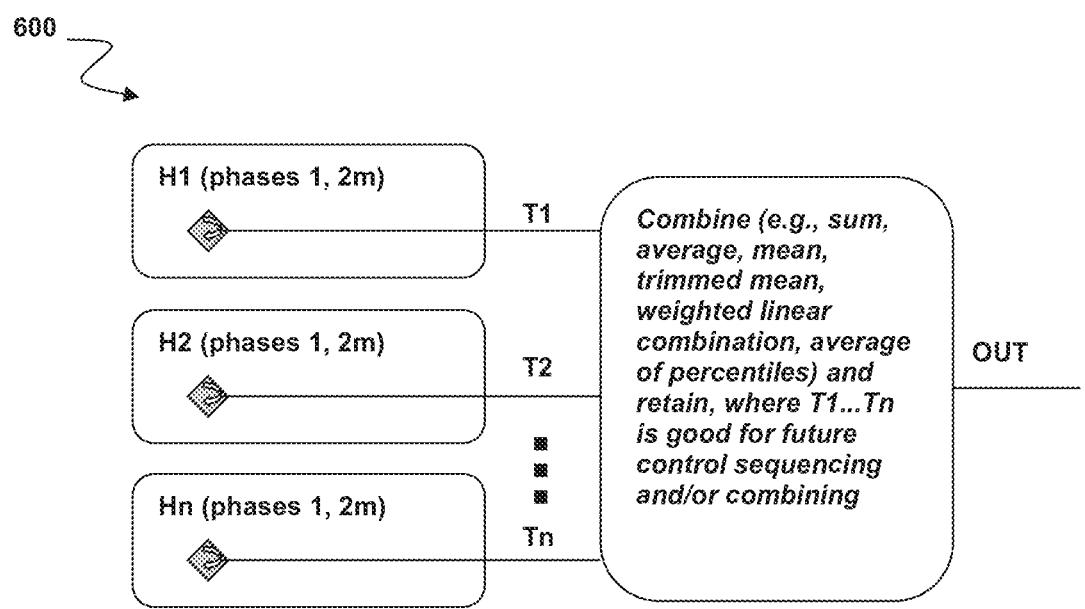
FIG. 6 is a flow diagram for a sensor system according to an embodiment.
Figure 7:
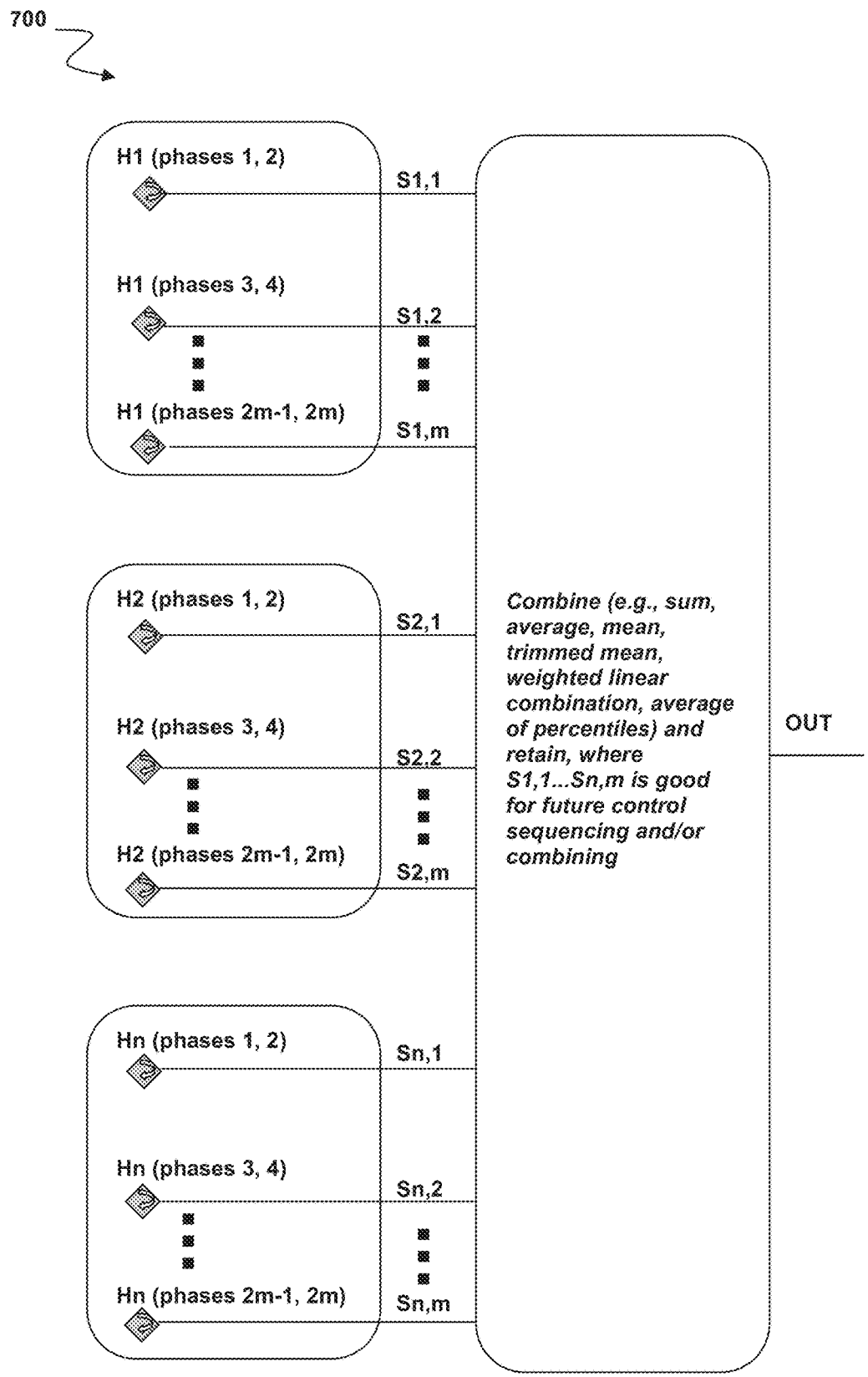
FIG. 7 is a flow diagram for a sensor system according to an embodiment.

FIG. 6 depicts a simplified version of system 500, which does not split up the spinning current scheme in partial spinning current schemes. Instead, system 600 directly computes the spinning current output signals $T_i$ without evaluating the distribution of partial spinning current output signals. In yet another embodiment, and referring to FIG. 7, it is possible to combine all partial spinning current output signals (and optionally evaluate the distribution of them including the identification of outliers) in a single step in a system 700.

The evaluation of outlier devices and other analyses discussed above with respect to other embodiments also can be carried out here with respect to system 400 as well as for systems 300, 500 and others. In system 400, for example, it could be determined that particular contacts give rise to asymmetries, such as terminals C1 and Cn which are at the ends of device H, and therefore could be omitted from use.

Embodiments therefore relate to sensor systems comprising a plurality of sensor devices which can be operated sequentially or at the same time in spinning current-type modes to provide a plurality of individual output signals. Some or all of the individual output signals then can be used to determine an overall output signal having reduced residual offset as well as to analyze the performance or characteristics of the individual sensor devices. While embodiments can reduce or eliminate residual offset errors, other stochastic errors also can be reduced or eliminated. Any sensor devices which underperform, such as by exhibiting high residual offset or other characteristics contributing to outlying results, can be omitted. This omission can take many forms, such as by simply not using a particular individual output signal, not using any signal from that device, or not operating that device in subsequent phases. The sensor devices can comprise Hall effect devices, including both regular Hall effect devices and vertical Hall effect devices, or some other type of sensor, including the combination of several individual sensor devices coupled to form a single sensor device.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A sensor system comprising:
a plurality of sensor devices positioned proximate each other such that each of the plurality of sensor devices is configured to sense essentially the same condition, wherein the plurality of sensor devices comprise vertical Hall effect sensor devices;
control circuitry configured to operate each of the plurality of sensor devices in at least one partial spinning current mode comprising at least two phases to obtain a partial spinning current output signal in each phase by selectively coupling a first of the plurality of terminals of each of the plurality of sensor devices as a supply terminal and a second of the plurality of terminals of each of the plurality of sensor devices as a signal terminal such that, in sequential phases, current flows in different directions in each of the plurality of sensor devices; and
output circuitry configured to determine a system output signal from partial spinning current output signals of the at least two phases of each of at least two of the plurality of sensor devices,
wherein the output circuitry is further configured to compare the partial spinning current output signals of the plurality of sensor devices to determine a distribution of the partial spinning current output signals.

2. The sensor system of claim 1, wherein the output circuitry is configured to determine a system output signal from summing the partial spinning current output signals of at least two of the plurality of sensor devices.

3. The sensor system of claim 1, wherein the output circuitry is configured to determine a system output signal from averaging the partial spinning current output signals of at least two of the plurality of sensor devices.

4. The sensor system of claim 1, wherein a first of the Hall effect sensor devices comprises at least one of the same terminals a second of the Hall effect sensor devices, wherein the first and second Hall effect sensor devices are operated in different phases.

5. The sensor system of claim 1, wherein the control circuitry is configured such that in sequential phases different ones of the plurality of terminals of each of the plurality of sensor devices are operable as signal terminals.

6. The sensor system of claim 1, wherein the plurality of terminals comprises at least three terminals.

7. The sensor system of claim 1, wherein the distribution is used to determine a residual offset error affecting at least one of the plurality of sensor devices.

8. The sensor system of claim 1, wherein the output circuitry is further configured to omit from the determination of the system output signal at least one sensor device partial spinning current output signal that is an outlying signal within the distribution.

9. The sensor system of claim 1, wherein the control circuitry is configured to omit from operation in a subsequent spinning current mode at least one sensor device having a partial spinning current output signal that is an outlying signal within the distribution.

10. The sensor system of claim 9, wherein the output circuitry is configured to determine the distribution during a manufacturing test and store a result of the test in a non-volatile memory.

11. The sensor system of claim 1, wherein the output circuitry is configured to carry out the comparison periodically.

12. The sensor system of claim 1, wherein the output circuitry is configured to carry out the comparison at least one of stochastically, upon a request, or upon an input.

13. The sensor system of claim 1, wherein the control circuitry is configured to operate each of the plurality of sensor devices sequentially in a spinning current mode.

14. The sensor system of claim 1, wherein the control circuitry is configured to operate at least two of the plurality of sensor devices simultaneously in a spinning current mode.

* * * * *